United States Patent
Ryuzaki et al.

(10) Patent No.: US 8,728,341 B2
(45) Date of Patent: May 20, 2014

(54) POLISHING AGENT, CONCENTRATED ONE-PACK TYPE POLISHING AGENT, TWO-PACK TYPE POLISHING AGENT AND METHOD FOR POLISHING SUBSTRATE

(75) Inventors: Daisuke Ryuzaki, Kokubunji (JP); Takenori Narita, Hitachi (JP); Yousuke Hoshi, Tsukuba (JP); Tomohiro Iwano, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 18 days.

(21) Appl. No.: 13/388,169

(22) PCT Filed: Sep. 14, 2010

(86) PCT No.: PCT/JP2010/065850
§ 371 (c)(1),
(2), (4) Date: Jan. 31, 2012

(87) PCT Pub. No.: WO2011/048889
PCT Pub. Date: Apr. 28, 2011

(65) Prior Publication Data
US 2012/0129346 A1 May 24, 2012

(30) Foreign Application Priority Data

Oct. 22, 2009 (JP) .............................. P2009-243340
Nov. 24, 2009 (JP) .............................. P2009-266571

(51) Int. Cl.
| | | |
|---|---|---|
| C09K 13/00 | (2006.01) | |
| H01L 21/00 | (2006.01) | |
| C09K 3/14 | (2006.01) | |
| C09G 1/02 | (2006.01) | |
| B24B 1/00 | (2006.01) | |
| H01L 21/3105 | (2006.01) | |

(52) U.S. Cl.
CPC .............. C09K 3/1463 (2013.01); C09G 1/02 (2013.01); B24B 1/00 (2013.01); H01L 21/31053 (2013.01)
USPC ....... 252/79.4; 252/79.1; 252/79.2; 252/79.5; 51/309; 216/88; 216/89; 438/692; 438/693

(58) Field of Classification Search
CPC ...... C09K 3/1409; C09K 3/1463; C09G 1/02; C09G 1/04; B24B 1/00; H01L 21/00; H01L 21/31053
USPC ................. 252/79.1, 79.2, 79.4, 79.5; 51/309; 216/88, 89; 438/692, 693
See application file for complete search history.

(56) References Cited

U.S. PATENT DOCUMENTS

| | | | |
|---|---|---|---|
| 4,539,145 A * | 9/1985 | Alvarez et al. ................. | 510/421 |
| 2004/0065022 A1 | 4/2004 | Machii et al. | |

(Continued)

FOREIGN PATENT DOCUMENTS

| | | |
|---|---|---|
| CN | 1746255 | 3/2006 |
| CN | 1795543 | 6/2006 |

(Continued)

OTHER PUBLICATIONS

English translation of the International Preliminary Report on Patentability, including the Written Opinion of the International Searching Authority, dated May 24, 2012, for International (PCT) Application No. PCT/JP2010/065850.

(Continued)

*Primary Examiner* — Shamim Ahmed
(74) *Attorney, Agent, or Firm* — Antonelli, Terry, Stout & Kraus, LLP.

(57) ABSTRACT

A polishing agent of the invention comprises tetravalent metal hydroxide particles, a cationized polyvinyl alcohol, at least one type of saccharide selected from the group consisting of an amino sugar, a derivative of the amino sugar, a polysaccharide containing an amino sugar and a derivative of the polysaccharide, and water. The method for polishing a substrate of the invention comprises a step of polishing the silicon oxide film 1 (film to be polished), formed on the silicon substrate 2 having the silicon oxide film 1, by relatively moving the silicon substrate 2 and a polishing platen, in a state that the silicon oxide film 1 is pressed against a polishing pad on the polishing platen, while supplying the polishing agent of the invention between the silicon oxide film 1 and the polishing pad.

21 Claims, 3 Drawing Sheets

(56) References Cited

U.S. PATENT DOCUMENTS

| | | |
|---|---|---|
| 2006/0289826 A1 | 12/2006 | Koyama et al. |
| 2009/0239373 A1* | 9/2009 | Shida et al. .................. 438/618 |
| 2011/0039475 A1* | 2/2011 | Hoshi et al. ..................... 451/28 |

FOREIGN PATENT DOCUMENTS

| | | |
|---|---|---|
| JP | 08-022970 | 1/1996 |
| JP | 10-106994 | 4/1998 |
| JP | 2000-109809 | 4/2000 |
| JP | 2008-091524 | 4/2008 |
| JP | 2009-094233 | 4/2009 |
| JP | 2010-141288 | 6/2010 |
| KR | 10-2006-0013422 | 2/2006 |
| WO | WO02/067309 | 8/2002 |
| WO | WO2004/107429 | 12/2004 |
| WO | WO 2009/058274 | 5/2009 |
| WO | WO2009/131133 | 10/2009 |

OTHER PUBLICATIONS

Korean Official Action dated Jul. 6, 2012, for KR Application No. 10-2011-7031480.
Chinese Official Action dated Dec. 26, 2012, for CN Application No. 201080032887.2.
Chinese Official Action dated Dec. 2, 2013, for CN Application No. 201210074729.4.

* cited by examiner

POLISHING AGENT, CONCENTRATED ONE-PACK TYPE POLISHING AGENT, TWO-PACK TYPE POLISHING AGENT AND METHOD FOR POLISHING SUBSTRATE

TECHNICAL FIELD

The present invention relates to a polishing agent to be used for polishing of a substrate on which a film to be polished has been formed, especially a semiconductor board on which a silicon oxide-based insulating film has been formed, as well as to a concentrated one-pack type polishing agent and a two-pack type polishing agent to become the polishing agent, and a method for polishing a substrate that employs the polishing agent.

BACKGROUND ART

In recent years, machining techniques for increasing density and micronization are becoming ever more important in manufacturing steps for semiconductor elements. One such technique, chemical mechanical polishing (CMP), has become an essential technique in steps for semiconductor elements, for formation of Shallow Trench Isolation (STD, flattening of premetal insulating films and interlayer insulating films, and formation of plugs and embedded metal wirings.

In most CMP steps, polishing proceeds by pressing a film to be polished of a substrate on which the film to be polished has been formed against a polishing pad, and relatively moving the substrate and the polishing pad while supplying a polishing agent between the film to be polished and the polishing pad. The polishing agent and polishing pad is the major factor that determines the polishing properties including the polishing rate and flatness of the film to be polished, the polishing selectivity, the number of scratches and the in-plane uniformity of the substrate. In particular, the polishing properties vary significantly depending on the type of abrasive and additives in the polishing agent and the material and hardness of the polishing pad.

The polishing agents commonly used for CMP steps are polishing agents containing silicon oxide (silica) abrasives such as fumed silica or colloidal silica. It is known that a wide range of different films can be polished by appropriately selecting the abrasive concentration, pH and additives in the silica-based polishing agent.

Demand is also increasing for polishing agents comprising cerium compound abrasives, mainly designed for silicon oxide-based insulating films such as silicon oxide films. For example, ceria-based polishing agents comprising cerium oxide (ceria) particles as the abrasive are known to allow polishing of silicon oxide-based insulating films at high rate, with lower abrasive concentrations than silica-based polishing agents.

It is also known that addition of appropriate additives to ceria-based polishing agents can improve flatness and polishing selectivity.

In STI-forming steps, for example, a silicon oxide-based insulating film, as the film to be polished, is formed on a silicon substrate to embed the silicon oxide-based insulating film in trenches created at the silicon substrate. In such steps, irregularities reflecting the step heights of the trenches created in the lower silicon substrate are generally produced on the surface of the silicon oxide-based insulating film. Appropriate selection of the additives added to the ceria-based polishing agent for polishing of the silicon oxide-based insulating film can increase the polishing rate ratio on the convexities with respect to the polishing rate on the concavities of the silicon oxide-based insulating film. As a result, the convexities of the silicon oxide-based insulating film are polished preferentially compared to the concavities, and therefore, the post-polishing flatness can be improved.

Moreover, it is common in STI-forming steps to provide a silicon nitride film or polysilicon film (pSi film) as a polishing stop layer at the lower layer of the silicon oxide-based insulating film. Appropriate selection of the additives added to the ceria-based polishing agent for polishing of the silicon oxide-based insulating film can increase the polishing rate ratio (the polishing selective ratio) for the silicon oxide-based insulating film with respect to the polishing stop layer. As a result, it is easier to stop polishing when the polishing stop layer has been exposed, and the polishing stop property can be increased. Cerium oxide (ceria)-based polishing agents to be used in CMP steps are disclosed in Patent document 1 and Patent document 2, for example.

Incidentally, with the micronization of circuit dimensions of semiconductor devices in recent years, scratch generated during CMP steps is becoming a serious problem. This is because scratch produced in the film to be polished during the CMP steps causes wire breakage and shorts in microscopic transistors and interconnections.

Methods for reducing the number of scratches have been proposed, wherein the mean particle size of the abrasive in the polishing agent is reduced. For example, Patent document 3 describes a polishing agent wherein fine tetravalent metal hydroxide particles are used as the abrasive.

Patent Document 3 teaches that the polishing agent comprising tetravalent metal hydroxide particles reduces the number of scratches compared to conventional ceria-based polishing agents. Furthermore, Patent document 3 also teaches that a prescribed polishing selective ratio can be obtained with a polishing agent comprising the tetravalent metal hydroxide particles and prescribed additives.

CITATION LIST

Patent Literature

[Patent document 1] Japanese Unexamined Patent Application Publication HEI No. 08-022970

[Patent document 2] Japanese Unexamined Patent Application Publication HEI No. 10-106994

[Patent document 3] International Patent Publication No. WO02/067309

SUMMARY OF INVENTION

Technical Problem

When the circuit dimensions of a semiconductor device are micronized, lack of flatness and polishing selective ratio becomes a serious problem in CMP steps, in addition to the aforementioned problem of scratches.

When flatness is inadequate during CMP steps, it is difficult to form microcircuits with high precision in subsequent photolithography steps. Therefore, higher flatness is preferred in CMP steps, and polishing agents that can further increase flatness are desired.

Also, when the polishing selective ratio is inadequate in CMP steps, it is difficult to stop polishing when the polishing stop layer has been exposed, and therefore polishing proceeds excessively. As a result, it is difficult to increase the polishing stop property. Therefore, a higher polishing selective ratio is preferred in CMP steps, and polishing agents that can further increase the polishing selective ratio are desired.

A silicon nitride film or polysilicon film is generally used as the polishing stop layer. However, it is difficult to prepare a polishing agent that has a sufficient polishing selective ratio for both types of polishing stop layer, and therefore it has been necessary to change the polishing agent depending on the polishing stop layer.

In light of these problems, it is an object of the present invention to provide a polishing agent that, in a CMP technique in which a film to be polished such as a silicon oxide-based insulating film is polished, allows polishing of the film to be polished to a high degree of flatness while inhibiting scratches, as well as a concentrated one-pack type polishing agent and a two-pack type polishing agent for obtaining the polishing agent. It is another object of the present invention to provide a method for polishing a substrate using the polishing agent. It is yet another object of the present invention to provide a polishing agent that has a satisfactory polishing selective ratio and can increase the polishing stop property, whether using a silicon nitride film or a polysilicon film as the polishing stop layer, as well as a concentrated one-pack type polishing agent and a two-pack type polishing agent for obtaining the polishing agent, and a method for polishing a substrate using the polishing agent.

Unless otherwise specified, the polishing selective ratio with respect to a silicon nitride film means the polishing rate ratio for the film to be polished (for example, a silicon oxide-based insulating film) with respect to the silicon nitride film (polishing rate of film to be polished/polishing rate of silicon nitride film), and a high polishing selective ratio or excellent polishing selective ratio means that the ratio of the polishing rates is sufficiently large. The same applies for a polysilicon film.

Solution to Problem

The present inventors have found that the aforementioned problems can be solved by using a polishing agent comprising tetravalent metal hydroxide particles, a cationized polyvinyl alcohol, at least one type of saccharide selected from the group consisting of an amino sugar, a derivative of the amino sugar, a polysaccharide containing an amino sugar and a derivative of the polysaccharide, and water. That is, the present invention relates to a polishing agent comprising tetravalent metal hydroxide particles, a cationized polyvinyl alcohol, at least one type of saccharide selected from the group consisting of an amino sugar, a derivative of the amino sugar, a polysaccharide containing an amino sugar and a derivative of the polysaccharide, and water.

With the polishing agent of the invention, it is possible to accomplish polishing of films to be polished to a high degree of flatness while preventing scratches, in CMP techniques for polishing of films to be polished. Moreover, with the polishing agent of the invention it is possible to obtain a satisfactory polishing selective ratio and increase the polishing stop property, whether using a silicon nitride film or a polysilicon film as the polishing stop layer. The present inventors conjecture that these effects exhibited by the invention are based on the following interactions between the constituent components. However, their cause is not limited to this explanation.

Because the tetravalent metal hydroxide particles are fine particles, they are presumed to be especially effective for preventing scratches.

In addition, it is conjectured that the cationized polyvinyl alcohol adsorbs mainly onto the tetravalent metal hydroxide particles, while at least one type of saccharide selected from the group consisting of an amino sugar, a derivative of the amino sugar, a polysaccharide containing an amino sugar and a derivative of the polysaccharide, adsorbs mainly onto the film to be polished. Presumably as a result of this, appropriate interaction occurs between the tetravalent metal hydroxide particles and the film to be polished. It is conjectured that the interaction creates an effect whereby the convexities of the film to be polished are polished preferentially compared to the concavities, and that this is particularly effective for polishing of the film to be polished to a high degree of flatness.

Furthermore, it is conjectured that at least one type of saccharide selected from the group consisting of an amino sugar, a derivative of the amino sugar, a polysaccharide containing an amino sugar and a derivative of the polysaccharide, adsorbs onto the polishing stop layer in addition to the film to be polished. Presumably as a result of this, appropriate interaction occurs between the tetravalent metal hydroxide particles and the polishing stop layer. It is conjectured that the interaction creates an effect whereby the film to be polished is polished preferentially compared to the polishing stop layer, and that this is particularly effective for increasing the polishing selective ratio.

The mean particle size of the tetravalent metal hydroxide particles is preferably 1-400 nm.

The zeta potential of the tetravalent metal hydroxide particles in the polishing agent is preferably −30 to 50 mV.

The pH of the polishing agent of the invention is preferably 3.0-11.0.

The content of the tetravalent metal hydroxide particles is preferably 0.005-5 parts by mass with respect to 100 parts by mass of the polishing agent.

The content of the cationized polyvinyl alcohol is preferably at least 0.005 part by mass with respect to 100 parts by mass of the polishing agent, and the content of the saccharide is preferably at least 0.001 part by mass with respect to 100 parts by mass of the polishing agent.

The tetravalent metal hydroxide preferably includes cerium hydroxide.

Also, the saccharide preferably includes at least one selected from the group consisting of chitosan and chitosan derivatives.

The present invention further relates to a concentrated one-pack type polishing agent that becomes the aforementioned polishing agent by addition of at least water, the concentrated one-pack type polishing agent comprising the tetravalent metal hydroxide particles, the cationized polyvinyl alcohol, the saccharide and the water.

The invention still further relates to a two-pack type polishing agent which is stored with constituent components of the aforementioned polishing agent separated into a first solution and a second solution, so that the polishing agent is formed by mixing the first solution and the second solution, wherein the first solution comprises the tetravalent metal hydroxide particles and water.

The invention still further relates to a two-pack type polishing agent which becomes the aforementioned polishing agent by mixing the first solution, the second solution, and water.

The invention even further relates to a method for polishing a substrate, comprising a step of polishing a film to be polished, formed on a substrate having the film to be polished, by relatively moving the substrate and a polishing platen, in a state that the film to be polished is pressed against a polishing pad on the polishing platen, while supplying the aforementioned polishing agent between the film to be polished and the polishing pad.

The invention even further relates to the aforementioned method for polishing a substrate wherein at least a portion of the film to be polished is a silicon oxide-based insulating film.

The invention even further relates to the aforementioned method for polishing a substrate wherein at least a portion of the film to be polished is a silicon nitride film or polysilicon film.

In the invention, the term "silicon oxide-based insulating film" includes not only insulating films composed solely of silicon oxide, but also general silicon oxide-based films that are expected to function as insulating films (for example, phosphorus- or boron-doped silicon oxide films).

Advantageous Effects of Invention

According to the invention, it is possible to provide a polishing agent that accomplishes polishing of the film to be polished to a high degree of flatness while inhibiting scratches, and that has a satisfactory polishing selective ratio and can increase the polishing stop property, whether using a silicon nitride film or a polysilicon film as the polishing stop layer, in a CMP technique in which a film to be polished (for example, a silicon oxide-based insulating film) is polished, as well as a concentrated one-pack type polishing agent and a two-pack type polishing agent that can become the aforementioned polishing agent, and a method for polishing a substrate using the polishing agent.

DESCRIPTION OF EMBODIMENTS

Figure 1:
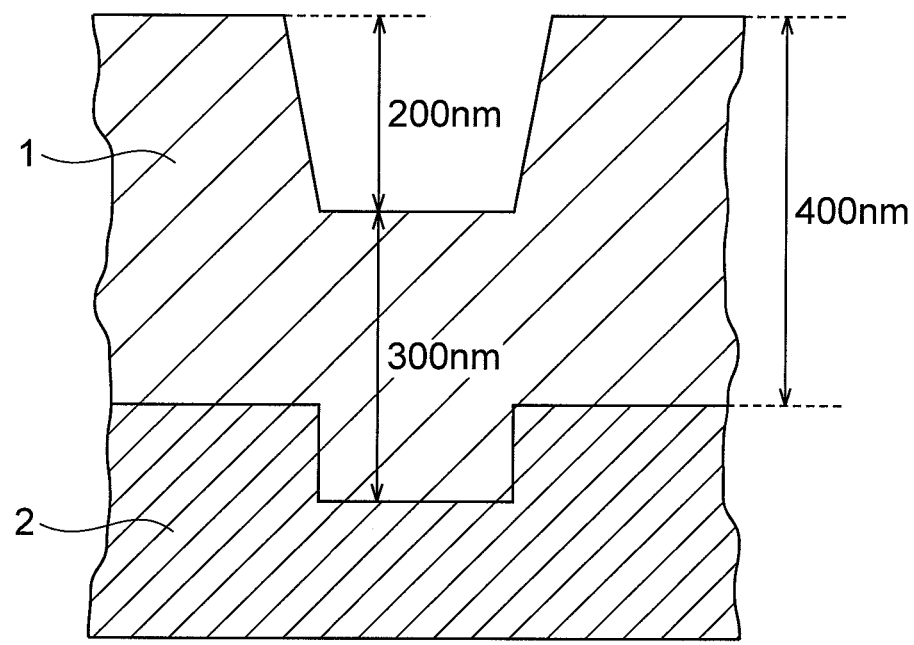
FIG. 1 is a schematic cross-sectional view of a $SiO_2$ patterned substrate used for polishing in the examples and comparative examples of the invention.

Throughout the present specification, a "polishing agent" is a composition that is contacted with a film to be polished during polishing, and specifically it comprises an abrasive, additives and water. Also, throughout the present specification, "additives" are components included in the polishing agent other than the abrasive and water.

The polishing agent of this embodiment characteristically comprises tetravalent metal hydroxide particles as the abrasive. The polishing agent comprising tetravalent metal hydroxide particles is preferred from the viewpoint of inhibiting scratches compared to a conventional ceria-based polishing agent.

The tetravalent metal hydroxide particles preferably include either or both of a rare earth metal hydroxide and zirconium hydroxide. A rare earth metal hydroxide is a hydroxide of a rare earth element, where the rare earth element refers to scandium, yttrium, lanthanum, cerium, praseodymium, neodymium, promethium, samarium, europium, gadolinium, dysprosium, holmium, erbium, thulium, ytterbium and lutetium. Cerium hydroxide is preferably used as the rare earth metal hydroxide from the viewpoint of high polishing rate. Also, the tetravalent metal hydroxide particles used may be a single type alone or a combination of two or more different types.

The method used to prepare the tetravalent metal hydroxide particles may be a method of mixing a tetravalent metal salt and an alkali solution. This method is described, for example, in "Kidorui no Kagaku" (G. Adachi, ed., Kagaku Dojin, 1999).

Preferred examples of tetravalent metal salts include $M(SO_4)_2$, $M(NH_4)_2(NO_3)_6$, $M(NH_4)_4(SO_4)_4$ (where M represents a rare earth element) and $Zr(SO_4)_2 \cdot 4H_2O$. M is more preferably cerium (Ce) which is chemically active.

The alkali solution used may be ammonia water, aqueous potassium hydroxide, aqueous sodium hydroxide or the like. Ammonia water is preferably used among these. Metal impurities in the tetravalent metal hydroxide particles synthesized by the method described above can be removed by washing. The method of washing the metal hydroxide particles may be a method of repeating solid-liquid separation by centrifugation several times.

The obtained tetravalent metal hydroxide particles will be aggregated in some cases, and they are preferably dispersed in water by an appropriate method. There are no particular restrictions on the method of dispersing the tetravalent metal hydroxide particles in water as the main dispersing medium, and it may be dispersion treatment by an ordinary stirrer, or a homogenizer, ultrasonic disperser, wet ball mill or the like may be used instead. The dispersion method and particle size control method may be the methods described, for example, in "Bunsan Gijutsu Daizenshu" (Johokiko Co., Ltd., July 2005).

The lower limit for the mean particle size of the tetravalent metal hydroxide particles in the polishing agent is preferably at least 1 nm, more preferably at least 2 nm and even more preferably at least 10 nm, from the viewpoint of further increasing the polishing rate of films to be polished (for example, silicon oxide-based insulating films).

The upper limit for the mean particle size of the tetravalent metal hydroxide particles in the polishing agent is preferably not greater than 400 nm, more preferably not greater than 300 nm and even more preferably not greater than 250 nm, from the viewpoint of further inhibiting scratches.

Throughout the present specification, the mean particle size of the tetravalent metal hydroxide particles in the polishing agent refers to the Z-average size, obtained by cumulant analysis using the dynamic light scattering method.

The mean particle size of the tetravalent metal hydroxide particles in the polishing agent can be measured using, for example, "Zetasizer Nano S" by Spectris Co., Ltd. More specifically, the polishing agent is diluted with water so that the concentration of the tetravalent metal hydroxide particles is 0.1 part by mass with respect to 100 parts by mass of the polishing agent, and approximately 1 mL is placed in a 1 cm-square cell and placed in a Zetasizer Nano S. Measurement is conducted at 25° C. with a dispersing medium refractive index of 1.33 and a viscosity of 0.887 mPa·s, and the value represented by the Z-average size is read as the mean particle size.

The lower limit for the zeta potential of the tetravalent metal hydroxide particles in the polishing agent is preferably at least −30 mV, more preferably at least −15 mV and even more preferably at least 0 mV, from the viewpoint of further increasing the polishing rate for films to be polished (for example, silicon oxide-based insulating films). The upper limit for the zeta potential is preferably not greater than 50 mV, more preferably not greater than 30 mV and even more preferably not greater than 20 mV, from the viewpoint of further increasing the flatness and polishing selective ratio.

The zeta potential of the tetravalent metal hydroxide particles in the polishing agent can be measured using, for example, "Zetasizer 3000 HS" by Spectris Co., Ltd. More specifically, the polishing agent is diluted with water to the scattered light quantity recommended by the Zetasizer 3000 HS, and measurement is performed at room temperature.

The lower limit for the content of the tetravalent metal hydroxide particles in the polishing agent is preferably at least 0.005 part by mass, more preferably at least 0.01 part by mass and even more preferably at least 0.1 part by mass with respect to 100 parts by mass of the polishing agent, from the viewpoint of further increasing the polishing rate for films to be polished (for example, silicon oxide-based insulating films). Also, the upper limit for the content of the tetravalent metal hydroxide particles is preferably not greater than 5 parts by mass, more preferably not greater than 3 parts by mass and even more preferably not greater than 2 parts by mass with respect to 100 parts by mass of the polishing agent, from the viewpoint of further inhibiting scratches.

The polishing agent of this embodiment characteristically comprises a cationized polyvinyl alcohol as an additive. A cationized polyvinyl alcohol is a modified polyvinyl alcohol produced by introducing a cationic functional group into a polyvinyl alcohol. The cationized polyvinyl alcohol may be obtained by, for example, as a block polymer or random polymer of polyvinyl alcohol and a cationic functional group-containing monomer.

Examples of cationic functional group-containing monomers for forming the aforementioned polymer include acrylamide-based monomer, methacrylamide-based monomer, crotonylamide-based monomer, acrylic acid-based monomer, methacrylic acid-based monomer and crotonic acid-based monomer and the like.

The degree of modification of the cationized polyvinyl alcohol by the cationic functional groups is not particularly restricted, but it is preferably at least 0.1 mol %, more preferably at least 0.5 mol % and even more preferably at least 1 mol %, from the viewpoint of further increasing the flatness or polishing selective ratio.

The saponification degree of the cationized polyvinyl alcohol is not particularly restricted, but it is preferably at least 50 mol %, more preferably at least 60 mol % and even more preferably at least 70 mol %, from the viewpoint of increasing the solubility in water. The saponification degree of the cationized polyvinyl alcohol can be measured according to JIS K 6726 (polyvinyl alcohol test method).

The upper limit for the mean polymerization degree of the cationized polyvinyl alcohol is not particularly restricted, but it is preferably not greater than 3000, more preferably not greater than 2000 and even more preferably not greater than 1000, from the viewpoint of further increasing the polishing rate for films to be polished (for example, silicon oxide-based insulating films). The lower limit for the mean polymerization degree is preferably at least 50, more preferably at least 100 and even more preferably at least 150, from the viewpoint of further increasing the flatness or polishing selective ratio. The mean polymerization degree of the cationized polyvinyl alcohol can be measured according to JIS K 6726 (polyvinyl alcohol test method).

The lower limit for the content of the cationized polyvinyl alcohol in the polishing agent is preferably at least 0.005 part by mass, more preferably at least 0.01 part by mass and even more preferably at least 0.1 part by mass with respect to 100 parts by mass of the polishing agent, from the viewpoint of further increasing the flatness or polishing selective ratio. The upper limit for the content of the cationized polyvinyl alcohol is preferably not greater than 10 parts by mass, more preferably not greater than 5 parts by mass and even more preferably not greater than 2 parts by mass with respect to 100 parts by mass of the polishing agent, from the viewpoint of further increasing the polishing rate for films to be polished (for example, silicon oxide-based insulating films).

The polishing agent of this embodiment characteristically comprises at least one type of saccharide selected from the group consisting of an amino sugar, a derivative of the amino sugar, a polysaccharide containing an amino sugar and a derivative of the polysaccharide as an additive, in addition to the cationized polyvinyl alcohol. By combining the cationized polyvinyl alcohol with at least one type of saccharide selected from the group consisting of an amino sugar, a derivative of the amino sugar, a polysaccharide containing an amino sugar and a derivative of the polysaccharide, it is possible to obtain a polishing agent that produces excellent flatness on films to be polished (for example, silicon oxide-based insulating films).

Also, with polishing agents comprising tetravalent metal hydroxide particles, which have been discovered by the present inventors in the past, polishing pad dependence is often seen in which the flatness of the silicon oxide-based insulating film is more excellent with a higher Shore D hardness of the polishing pad. However, according to this embodiment it is possible to stably obtain high flatness of the film to be polished (for example, silicon oxide-based insulating film) regardless of the Shore D hardness of the polishing pad, and this is therefore advantageous in terms of widening the options for polishing pads.

Furthermore, by combining the cationized polyvinyl alcohol with at least one type of saccharide selected from the group consisting of an amino sugar, a derivative of the amino sugar, a polysaccharide containing an amino sugar and a derivative of the polysaccharide, it is possible to obtain a polishing agent with an excellent polishing selective ratio with respect to silicon nitride films or polysilicon films. Incidentally, the present inventors have found that even if a common polyvinyl alcohol that has not been cationized is used, the polishing selective ratio with respect to polysilicon films is increased to a small degree. However, the present inventors have also found that the polishing selective ratio with respect to polysilicon films is drastically increased and the polishing selective ratio with respect to silicon nitride films is also drastically increased if a cationized polyvinyl alcohol is used.

In this embodiment, an amino sugar is a sugar containing an amino group, such as glucosamine, galactosamine or the like, and it may also be a derivative thereof. Examples of derivatives include N-acetylglucosamine, glucosamine sulfate, N-carbamoylglucosamine, glucosamine hydrochloride, glucosamine acetate, glucosamine sulfate, N-acetylgalactosamine and the like.

Also, in this embodiment, a polysaccharide containing an amino sugar is one obtained by bonding monosaccharides by a glycoside bond, and it contains at least one of the aforementioned amino sugars. Examples of the polysaccharides containing an amino sugar include chitin, chitosan, glucosamine, chondroitin, hyaluronic acid, keratan sulfate, heparan sulfate, heparin and dermatan sulfate, as well as their derivatives.

The polysaccharide containing an amino sugar is especially preferably at least one selected from the group consisting of chitosan and chitosan derivatives, from the viewpoint of further increasing the flatness and polishing selective ratio. Examples of chitosan derivatives include chitosan pyrrolidone carboxylate, cationization chitosan, hydroxypropylchitosan, chitosan lactate, glycerylated chitosan, glycol chitosan, carboxymethylchitosan (CM-chitosan) and carboxymethylchitosan succinamide.

The lower limit for the content of the saccharide which is at least one type of saccharide selected from the group consisting of an amino sugar, a derivative of the amino sugar, a polysaccharide containing an amino sugar and a derivative of the polysaccharide, in the polishing agent, is preferably at least 0.001 part by mass, more preferably at least 0.005 part by mass and even more preferably at least 0.01 part by mass with respect to 100 parts by mass of the polishing agent, from the viewpoint of further increasing the flatness and polishing selective ratio. The upper limit for the content is preferably not greater than 5 parts by mass, more preferably not greater than 1 part by mass and even more preferably not greater than 0.5 part by mass with respect to 100 parts by mass of the polishing agent, from the viewpoint of further increasing the polishing rate for films to be polished (for example, silicon oxide-based insulating films).

The polishing agent of this embodiment may also comprise, as additives, components other than the cationized polyvinyl alcohol and at least one type of saccharide selected from the group consisting of an amino sugar, a derivative of the amino sugar, a polysaccharide containing an amino sugar and a derivative of the polysaccharide. Examples of such components include acid components, alkaline components, amino acids, amphoteric surfactants, anionic surfactants, nonionic surfactants, cationic surfactants and other water-soluble polymers and organic solvents, which may be used alone or in combinations of 2 or more. Such components can adjust the polishing properties such as the polishing rate, flatness and polishing selective ratio, and can increase the storage stability of the polishing agent.

Examples of acid components include nitric acid, sulfuric acid, hydrochloric acid, phosphoric acid, boric acid, formic acid, acetic acid, propionic acid, butyric acid, valeric acid, caproic acid, lactic acid, malonic acid, succinic acid, glutaric acid, adipic acid, maleic acid, fumaric acid, phthalic acid, citric acid, picolinic acid and uric acid.

Examples of alkaline components include potassium hydroxide, sodium hydroxide, ammonia, tetramethylammonium hydroxide and imidazole.

Examples of amino acids include arginine, lysine, aspartic acid, glutamic acid, asparagine, glutamine, histidine, proline, tyrosine, tryptophan, serine, threonine, glycine, alanine, β-alanine, methionine, cysteine, phenylalanine, leucine, valine and isoleucine.

Examples of amphoteric surfactants include betaine, β-alanine betaine, lauryl betaine, stearyl betaine, lauryldimethylamine oxide, 2-alkyl-N-carboxymethyl-N-hydroxyethyl imidazolinium betaine, lauramidopropyl betaine, cocamidopropyl betaine and lauryl hydroxy sulfobetaine.

Examples of anionic surfactants include triethanolamine lauryl sulfate, ammonium lauryl sulfate, triethanolamine polyoxyethylene alkyl ether sulfate and special polycarboxylic acid-type polymer dispersing agents.

Examples of nonionic surfactants include polyoxyethylene lauryl ether, polyoxyethylene cetyl ether, polyoxyethylene stearyl ether, polyoxyethylene oleyl ether, polyoxyethylene higher alcohol ethers, polyoxyethylene octyl phenyl ether, polyoxyethylene nonyl phenyl ether, polyoxyalkylene alkyl ethers, polyoxyethylene derivatives, polyoxyethylene sorbitan monolaurate, polyoxyethylene sorbitan monopalmitate, polyoxyethylene sorbitan mono stearate, polyoxyethylene sorbitan tristearate, polyoxyethylene sorbitan monooleate, polyoxyethylene sorbitan trioleate, polyoxyethylene tetraoleate sorbitol, polyethyleneglycol monolaurate, polyethyleneglycol monostearate, polyethyleneglycol distearate, polyethyleneglycol monooleate, polyoxyethylenealkylamines, polyoxyethylene hydrogenated castor oil, 2-hydroxyethyl methacrylate, alkylalkanolamides, and the like.

Examples of cationic surfactants include coconut amine acetate and stearylamine acetate.

Examples of other water-soluble polymers include polysaccharides such as alginic acid, pectic acid, carboxymethylcellulose, agar, curdlan and pullulan (with the exception of polysaccharides containing an amino sugar); polycarboxylic acids and their salts such as polyaspartic acid, polyglutamic acid, polylysine, polymalic acid, polyamic acid, polymaleic acid, polyitaconic acid, polyfumaric acid, poly(p-styrenecarboxylic acid), polyamic acid ammonium salt, polyamic acid sodium salt and polyglyoxylic acid; vinyl-based polymers such as polyvinyl alcohol, polyvinylpyrrolidone and polyacrolein; acrylic-based polymers such as polyacrylamide and polydimethylacrylamide; polyethylene glycol, polyoxypropylene, polyoxyethylene-polyoxypropylene condensation product, and polyoxyethylene-polyoxypropylene block polymers of ethylenediamine.

Examples of organic solvents include alcohols such as methyl alcohol, ethyl alcohol, propyl alcohol, isopropyl alcohol, n-butyl alcohol, isobutyl alcohol, sec-butyl alcohol and tert-butyl alcohol; hydrocarbons such as hexane, cyclohexane and heptane; and ethers, ketones, esters and the like.

The polishing agent of this embodiment characteristically comprises water. There are no particular restrictions on the water, but deionized water, ion-exchanged water or ultrapure water is preferred. The water content in the polishing agent may be the content of the remainder excluding the aforementioned components, and it is not particularly restricted so long as water is present in the polishing agent.

The lower limit for the pH of the polishing agent of this embodiment is preferably at least 3.0, more preferably at least 4.5 and even more preferably at least 5.5, from the viewpoint of further increasing the polishing rate for films to be polished (for example, silicon oxide-based insulating films). The upper limit for the pH of the polishing agent is preferably not greater than 11.0, more preferably not greater than 9.0 and even more preferably not greater than 7.0, from the viewpoint of increasing the storage stability of the polishing agent.

The pH of the polishing agent can be measured using a common pH meter employing a glass electrode, an example of which is "Model pH 81" by Yokogawa Electric Corp. More specifically, it can be measured using a phthalate pH buffering solution (pH 4.01) and neutral phosphate pH buffering solution (pH 6.86) as the standard buffer, placing a Model pH 81 electrode in the polishing agent after 2-point calibration of the Model pH 81, and measuring the value upon stabilization after an elapse of 2 minutes or more. The liquid temperature of the standard buffer and polishing agent are both 25° C.

There are no particular restrictions on the method of storing the polishing agent of this embodiment. For example, it may be stored as a one-pack polishing agent comprising the abrasive, additives and water. Alternatively, for example, it may be stored as a concentrated one-pack type polishing agent having a reduced water content from the one-pack polishing agent. It may also be stored, for example, with the constituent components of the polishing agent separated into a slurry (first solution) and an additional solution (second solution), so that the slurry and additional solution are mixed to form the polishing agent of this embodiment. In this case, for example, the slurry comprises at least an abrasive and water, and for example, the additional solution comprises at least one component among the additives (for example, either or both of a cationized polyvinyl alcohol and saccharide) and water. Alternatively, for example, it may be stored as a concentrated two-pack type polishing agent comprising a concentrated slurry (first solution) and a concentrated additional solution (second solution), having reduced water contents from the slurry and the additional solution.

The concentrated one-pack type polishing agent of this embodiment comprises an abrasive, an additive and water, and is used as the aforementioned polishing agent by addition of the necessary amount of water either before or during polishing. The two-pack type polishing agent of this embodiment is used as the aforementioned polishing agent by mixing the slurry and additional solution either before or during polishing. The concentrated two-pack type polishing agent of this embodiment is also used as the aforementioned polishing agent by admixture of the necessary amount of water with the slurry and additional solution, either before or during polishing.

Thus, the polishing agent can increase storage stability if the polishing agent is stored as a concentrated one-pack type polishing agent, a two-pack type polishing agent or a concentrated two-pack type polishing agent.

The method for polishing a substrate when using a one-pack polishing agent characteristically comprises a polishing step of polishing a film to be polished, formed on a substrate having the film to be polished, by relatively moving the substrate and a polishing platen, in a state that the film to be polished is pressed against a polishing pad on the polishing platen, while supplying the aforementioned between the film to be polished and the polishing pad.

The method for polishing a substrate when using a two-pack type polishing agent may comprise a polishing agent preparation step in which a polishing agent is obtained by mixing the slurry and additional solution, before the polishing step of the polishing method using a one-pack polishing agent. In the polishing step, the film to be polished may be polished by a polishing agent obtained by mixing the slurry and the additional solution, while supplying both the slurry and additional solution between the polishing pad and the film to be polished.

In this embodiment, the "film to be polished" is defined as the film exposed at the substrate surface before, during or after polishing. When the substrate itself is exposed at the surface, the substrate may be considered in general to be the film to be polished.

The film to be polished may be a single film, or a plurality of films. When a plurality of films are exposed on the substrate surface before, during or after polishing, they may be considered to be the film to be polished.

The initial surface of the film to be polished may be smooth or irregular. The step height of the irregularities on the film to be polished surface is defined as the difference between the maximum height and the minimum height of the film to be polished, measured from a standard surface parallel to the substrate. The step height of the irregularities on the film to be polished surface can be determined, for example, by using an optical film thickness measuring device to measure the thickness at the convexities and the concavities of the film to be polished, or by using a stylus step profiler to directly measure the difference of elevation between the convexities and concavities of the film to be polished.

A larger step height of irregularities on the initial surface of the film to be polished allows the flattening effect of the method for polishing a substrate of this embodiment to be more notably exhibited. The step height of irregularities on the initial surface of the film to be polished is preferably at least 50 nm, more preferably at least 100 nm and even more preferably at least 150 nm.

There are no particular restrictions on the material of the film to be polished, and an insulator, semiconductor or metal may be polished. From the viewpoint of obtaining high polishing rate by the method for polishing a substrate of this embodiment, at least a portion of the film to be polished is preferably a silicon-based compound.

Examples of films to be polished of silicon-based compounds include crystalline silicon, amorphous silicon films, polysilicon films, silicon germanium films, metal silicide films, silicon nitride films, silicon carbide films, silicon carbonitride films and silicon oxide-based insulating films. Especially preferred among these are films to be polished with at least a portion thereof consisting of a silicon oxide-based insulating film, from the viewpoint of obtaining high polishing rate. Examples of silicon oxide-based insulating films include silicon oxide films, silicon oxynitride films, silicon carbonate films, hydrogen group-introduced silicon oxide films, methyl group-introduced silicon oxide films, boron-doped silicon oxide films and phosphorus-doped silicon oxide films.

Examples of films to be polished other than silicon-based compounds include high-permittivity films of hafnium-based, titanium-based or tantalum-based oxides; metal films of copper, aluminum, tantalum, titanium, tungsten, cobalt or the like; semiconductor films of germanium, gallium nitride, gallium phosphide, gallium arsenide or organic semiconductors; phase-change films of germanium, antimony, tellurium and the like; inorganic conductive films of indium tin oxide and the like; and polymer resin films of polyimide-based, polybenzooxazole-based, acryl-based, epoxy-based, phenol-based, or the like.

There are no particular restrictions on the method of forming the film to be polished, and a chemical vapor deposition (CVD) method by thermal reaction or plasma reaction, a physical vapor deposition (PVD) method, a coating method, a thermal oxidation method, a plating method and the like, may be used.

Examples of methods of forming the silicon oxide-based insulating film include thermal CVD methods in which monosilane and oxygen are thermally reacted, sub-atmospheric CVD methods in which tetraethoxysilane and ozone are thermally reacted, plasma CVD methods in which monosilane and nitrogen dioxide (or tetraethoxysilane and oxygen) are subjected to plasma reaction, and coating methods in which a liquid starting material comprising polysilazane, siloxane or the like is coated onto a substrate. The silicon oxide-based insulating film obtained by such a method may also contain elements other than silicon and oxygen, such as nitrogen, carbon, hydrogen, boron and phosphorus. This will allow adjustment of the film quality and the embedding property in the irregularities of the base layer. Heat treatment may also be conducted at a temperature of about 150-1100° C. if necessary following film formation, in order to stabilize the film quality of the silicon oxide-based insulating film obtained by the method described above.

Examples of silicon nitride film forming methods include low-pressure CVD methods in which dichlorsilane and ammonia are thermally reacted, plasma CVD methods in which monosilane, ammonia and nitrogen are subjected to plasma reaction, and the like. The silicon nitride film obtained by such a method may also contain elements other than silicon and nitrogen, such as carbon or hydrogen, in order to adjust the film quality.

Examples of polysilicon film forming methods include low-pressure thermal CVD methods in which monosilane is subjected to thermal reaction at low pressure, plasma CVD methods in which monosilane is subjected to plasma reaction, and the like. The polysilicon film obtained by such a method may also contain elements other than silicon, such as phosphorus, boron or hydrogen, in order to adjust the film quality.

There are no particular restrictions on the material of the substrate on the surface of which the film to be polished is to be formed, and it may be glass, crystalline silicon, amorphous silicon, polysilicon, silicon carbide, silicon germanium, germanium, gallium nitride, gallium phosphide, gallium arsenic, sapphire, plastic or the like. These substrates may also be polished by the method for polishing a substrate of this embodiment, as necessary.

There are no particular restrictions on the intended object of production using the method for polishing a substrate according to this embodiment, and for example, the method may be used for production of a semiconductor device; an image display device such as a liquid crystal or organic EL device; an optical part such as a photomask, lens, prism, optical fiber or single crystal scintillator; an optical element such as an optical switching element or optical waveguide; a light emitting element such as a solid laser or blue laser LED; a magnetic storage device such as a magnetic disk or magnetic head; a MEMS (Micro Electro Mechanical System), silicon interposer or similar device. Of these, the method for polishing a substrate of this embodiment is especially preferably used for a semiconductor device, which requires high polishing rate, high flatness, and a high degree of reduction in the number of scratches.

The semiconductor device may be a logic LSI such as a MPU (Micro Processing Unit) or DSP (Digital Signal Processor); a memory device such as a DRAM, SRAM or NAND Flash Memory, NOR Flash Memory, PRAM (Phase-Change Random Access Memory), FeRAM (Ferroelectric Random Access Memory), MRAM (Magnetoresistance Random Access Memory); an analog LSI such as wireless or communication LSI, AD conversion LSI or DA conversion LSI; an image sensor LSI such as a CMOS sensor or CCD; or a mounted LSI having such an LSI mounted on a single chip.

There are also no particular restrictions on the polishing steps for the semiconductor device to which the method for polishing a substrate of this embodiment is to be applied, and examples include polishing steps for STI-forming insulating films, polishing steps for premetal insulating films, polishing steps for interlayer insulating films, polishing steps for intermetal insulating films, polishing steps for tungsten plugs, polishing steps for polysilicon plugs, polishing steps for tungsten damascene wirings, polishing steps for copper damascene wirings, polishing steps for formation of various silicides, polishing steps for formation of High-k/damascene metal gates, and polishing steps for formation of embedded word lines in DRAMs.

When at least part of the film to be polished is a silicon oxide-based insulating film, a polishing stop film may be provided at the lower layer of the silicon oxide-based insulating film, but it may not be provided. When a polishing stop film is to be provided, either or both of a silicon nitride film or polysilicon film with a lower polishing rate than the silicon oxide-based insulating film preferably serves as the polishing stop film. More preferably, polishing is halted when either or both of the silicon nitride film or polysilicon film has been exposed. This will facilitate stopping of polishing when the polishing stop layer has been exposed, and therefore the polishing stop property will be increased.

There are no particular restrictions on polishing apparatuses that may be used in the polishing method of this embodiment. A common polishing apparatus having a substrate holder capable of holding the substrate, a polishing platen allowing attachment of the polishing pad, and a polishing agent supply mechanism, may be used. The substrate holder may be provided with a pressure mechanism that applies pressure by pressing the substrate against the polishing pad.

Each of the substrate holder and polishing platen may be provided with a motor or the like that allows variation of the rotational speed, for relative movement of the substrate and polishing pad. In addition, the polishing agent supply mechanism is provided with a mechanism to control the flow rate of the polishing agent, whereby a suitable amount of polishing agent can be supplied between the substrate and polishing pad. For most cases, the polishing agent supply method may be one in which the polishing agent is dropped onto the polishing pad. Examples of specific polishing apparatuses include "EPO-111", "EPO-222", "FREX-200" and "FREX-300" by Ebara Corp., "MIRRA, Reflexion" by Applied Materials Japan, Inc., and "ChaMP Series" by Tokyo Seimitsu Co., Ltd.

There are no particular restrictions on setting of the polishing conditions, but in order to prevent slipping of the substrate from the substrate holder, the platen rotational speed is preferably not greater than 200 rpm and the pressure on the substrate (polishing pressure) is preferably not greater than 100 kPa. There are also no particular restrictions on the amount of polishing agent supplied onto the polishing pad, but preferably the surface of the polishing pad is covered by the polishing agent at all times during polishing.

The method of supplying the polishing agent is not particularly restricted. When a concentrated one-pack type polishing agent is used for polishing, the method of supplying the polishing agent may be, for example, a method of directly conveying a mixture obtained by mixing the concentrated one-pack type polishing agent and water beforehand, or a method of conveying the concentrated one-pack type polishing agent and water through separate tubes and mixing them for supply as a mixture.

When a two-pack type polishing agent is used for polishing, the method of supplying the polishing agent may be, for example, a method of directly conveying a mixture obtained by mixing the slurry and additional solution, or a method of conveying the slurry and additional solution through separate tubes and mixing them for supply as a mixture.

When a concentrated two-pack type polishing agent is used for polishing, the method of supplying the polishing agent may be, for example, a method of directly conveying a mixture obtained by mixing the concentrated slurry, the concentrated additional solution and water, or a method of conveying the concentrated slurry, the concentrated additional solution and water in an arbitrary combination through separate tubes and mixing them for supply as a mixture.

There are no particular restrictions on the type of polishing pad that may be used, and for example, it may be a single-layer pad consisting essentially of a main pad (a member that directly contacts the film to be polished), a 2-layer pad comprising a sub pad as a layer under the main pad, or the like. Using a 2-layer pad will generally tend to improve the in-plane uniformity of the polished substrate.

There are no particular restrictions on the material that may be used for the main pad of the polishing pad, and for example, common non-foaming resins, foaming resins, porous resins and nonwoven fabrics may be used. Specific materials that may be used include polyurethanes, acryl compounds, polyesters, acryl-ester copolymers, polytetrafluoroethylene, polypropylene, polyethylene, poly-4-methylpentene, cellulose, cellulose esters, nylon, polyamides such as aramids, polyimides, polyimideamides, polysiloxane copolymers, oxirane compounds, phenol resins, polystyrenes, polycarbonates, epoxy resins and the like. From the viewpoint of lowering material cost, it is preferred to use a polyurethane resin. From the viewpoint of high polishing stability, it is preferred to use a foamed polyurethane resin.

There are no particular restrictions on the surface form of the main pad of the polishing pad, but it is preferably furrowed to allow pooling of the polishing agent. This will result in uniform and efficient spread of the polishing agent on the polishing pad, and therefore the in-plane uniformity of the polished substrate will be improved.

The lower limit for the Shore D hardness of the main pad of the polishing pad is not particularly restricted, but from the viewpoint of further increasing the flatness of polishing, it is preferably at least 40, more preferably at least 50 and even more preferably at least 55. From the viewpoint of further increasing the in-plane uniformity of the polished substrate, the upper limit for the Shore D hardness is preferably not greater than 80, more preferably not greater than 70 and even more preferably not greater than 65.

The Shore D hardness of the main pad of the polishing pad is defined as the value measured according to JIS K 6253. The Shore D hardness can be measured, for example, using an Asker Rubber Hardness Meter D by Kobunshi Keiki Co., Ltd. Because the measured value for the Shore D hardness generally includes measurement error of about ±1, the mean value obtained from 5 identical measurements is recorded. The upper limit for the Shore D hardness is defined as 100.

The surface of the polishing pad (main pad surface) is preferably consistently the same even with increased number of polishing, in order to minimize variation in the polishing properties for different substrates. For this purpose, the surface of the polishing pad may be subjected to conditioning, i.e. roughening or cleaning with a conditioner (also known as "dresser"), any number of times.

The conditioning may be carried out before, during or after polishing of each substrate. The initial surface of the polishing pad provided from the manufacturer is generally smooth, and therefore it is preferably subjected to conditioning (pad break-in) until the desired surface roughness is obtained before a new polishing pad is used for polishing.

The conditioner used will usually be a diamond abrasive conditioner having a diamond abrasive embedded in a pedestal. The size of the diamond abrasive in the diamond abrasive conditioner will generally correspond to at least 400 mesh and at most 40 mesh. Diamond abrasives of about 80-120 mesh are usually used.

The substrate that has completed polishing is preferably cleaned to remove the particles adhering to the substrate. The cleaning may be carried out using water, or in combination with dilute hydrofluoric acid or ammonia water, and a brush may also be used to increase the cleaning efficiency. The cleaned substrate is preferably dried after using a spin dryer or the like to remove off the water droplets adhering to the substrate.

Other methods of cleaning the substrate include a method in which cleaning is conducted using a low hardness buffing pad and a suitable cleaning liquid after polishing by the method for polishing a substrate of this embodiment. The cleaning liquid may be water, or a combination with dilute hydrofluoric acid or ammonia water.

EXAMPLES

Example 1

(Preparation of Polishing Agent)

After dissolving 430 g of $Ce(NH_4)_2(NO_3)_6$ in 7300 g of water in a 10 liter beaker, ammonia water was slowly added in an amount corresponding to 48 g of ammonia addition while stirring, to obtain a cerium hydroxide particle suspension. Dropping of the ammonia water involved slowly dropping 25 mass % ammonia water until the pH reached 2.5, and then slowly dropping 2.5 mass % ammonia water after the pH exceeded 2.5.

The solid component of the obtained suspension was separated out by centrifugal separation (acceleration: 1000 G, 5 minutes), the supernatant liquid was removed, and fresh water was added to conduct centrifugal separation again under the same conditions. This procedure was repeated 7 times for washing of the cerium hydroxide particles. Water was added to the washed cerium hydroxide particles, to obtain a suspension containing 1 mass % of cerium hydroxide particles.

Next, the cerium hydroxide particle suspension was irradiated with ultrasonic waves while stirring for dispersion of the cerium hydroxide particles. The dispersion was then filtered with a 1 μm membrane filter to obtain a cerium hydroxide concentrated slurry containing 1 mass % cerium hydroxide particles.

Also, a concentrated additional solution was prepared comprising 0.3 mass % cationized polyvinyl alcohol (CM-318 by Kuraray Co., Ltd., saponification degree: 86.0-91.0 mol %, mean polymerization degree: 1800), 0.2 mass % chitosan (DAICHITOSAN 100D (VL) by Dainichiseika Color & Chemicals Mfg. Co., Ltd.), 0.2 mass % acetic acid, 0.2 mass % imidazole and water. The chitosan was a type with a 20° C. viscosity of 5-7 mPa·s (manufacturer's nominal value) for a solution comprising 1 mass % of chitosan, 1 mass % of acetic acid and water.

Next, 100 g of the cerium hydroxide concentrated slurry, 100 g of the concentrated additional solution and 800 g of water were mixed to obtain polishing agent A1. The final contents of each component in polishing agent A1 are shown in Table 1.

(Polishing Agent Properties)

The mean particle size of the cerium hydroxide particles in the polishing agent was measured using "Zetasizer Nano S" by Spectris Co., Ltd.

The zeta potential of the cerium hydroxide particles in the polishing agent was measured using "Zetasizer 3000 HS" by Spectris Co., Ltd.

The pH of the polishing agent was measured using "Model pH 81" by Yokogawa Electric Corp.

For polishing agent A1, the mean particle size of the cerium hydroxide particles in the polishing agent was 127 nm, the zeta potential of the cerium hydroxide particles in the polishing agent was 11 mV, and the pH of the polishing agent was 6.0.

(Fabrication of Substrate)

A substrate was prepared having a silicon oxide film with a thickness of 500 nm accumulated on a flat-surface silicon substrate (circular, diameter: 200 mm) using plasma CVD by plasma reaction of tetraethoxysilane and oxygen. This will hereunder be referred to as "$SiO_2$ blanket substrate".

A substrate was also prepared having a silicon nitride film with a thickness of 500 nm accumulated on a flat-surface silicon substrate (circular, diameter: 200 mm) using low-pressure CVD by thermal reaction between dichlorsilane and ammonia. This will hereunder be referred to as "SiN blanket substrate".

A substrate was also prepared having a polysilicon film with a thickness of 500 nm accumulated on a flat-surface silicon substrate (circular, diameter: 200 mm) using low-pressure thermal CVD by thermal reaction of monosilane at low pressure. This will hereunder be referred to as "pSi blanket substrate".

A SiO₂ patterned substrate was also prepared. This substrate was produced in the following manner. Specifically, a plasma CVD method was used by plasma reaction of tetraethoxysilane and oxygen to accumulate a silicon oxide film with a thickness of 100 nm on a flat-surface silicon substrate (circular, diameter: 200 mm), and a photoresist film with a thickness of 500 nm was further coated thereover. In a known photolithography step using a photomask, the photoresist film was exposed and developed for a line-and-space pattern with a width (wide convexity width, same hereunder) of 100 μm and a pitch (sum of adjacent wide convexity width and wide concavity width pair, same hereunder) of 200 μm. Next, in a known dry etching step, the silicon oxide film and silicon substrate were subjected to dry etching of 100 nm each, and the photoresist film was removed in an ashing step by oxygen plasma.

Thus was formed an irregularity pattern comprising the silicon oxide film and silicon substrate, having line-and-space with a width of 100 μm, a pitch of 200 μm and a depth of 200 nm. Finally, a 300 nm-thick silicon oxide film was accumulated on the irregularity pattern using plasma CVD by plasma reaction of tetraethoxysilane and oxygen. The final structure of the substrate obtained in this manner was 400 nm-thick silicon oxide film 1/silicon substrate 2 at the wide convexities, as shown in the schematic cross-sectional view of FIG. 1. The wide concavity had the structure: 300 nm-thick silicon oxide film 1/silicon substrate 2, and the step height between the trench and wide convexity was 200 nm.

A SiO₂/SiN patterned substrate was also prepared. This substrate was produced in the following manner. Specifically, a low-pressure CVD method was used by thermal reaction of dichlorsilane and ammonia to accumulate a silicon nitride film with a thickness of 100 nm on a flat-surface silicon substrate (circular, diameter: 200 mm), and a photoresist film with a thickness of 500 nm was further coated thereover. In a known photolithography step using a photomask, the photoresist film was exposed and developed for a line-and-space pattern with a width of 100 μm and a pitch of 200 μm. Next, in a known dry etching step, the silicon nitride film and silicon substrate were subjected to dry etching of 100 nm each, and the photoresist film was removed in an ashing step by oxygen plasma.

Figure 2:
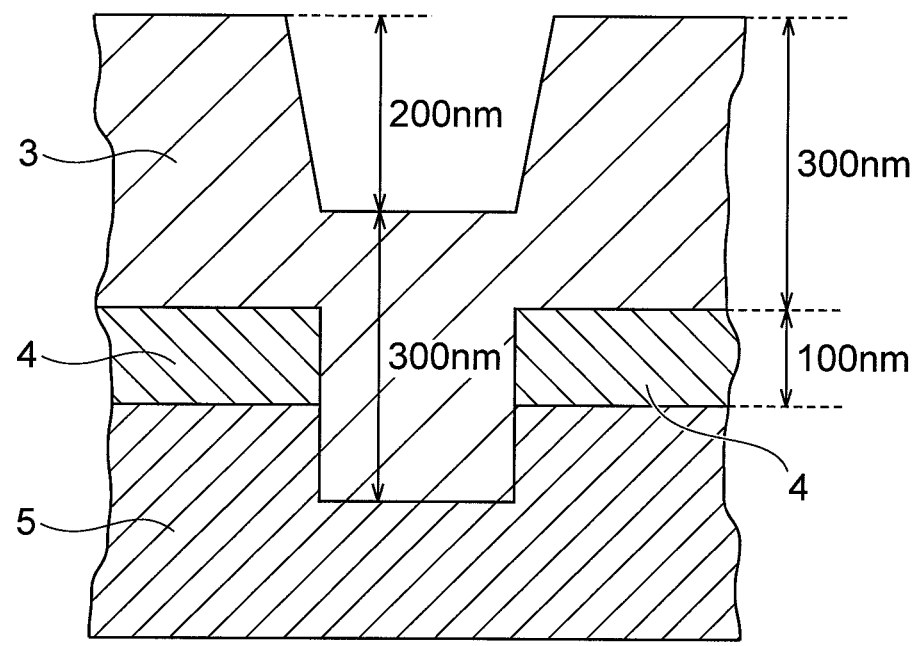
FIG. 2 is a schematic cross-sectional view of a $SiO_2$/SiN patterned substrate used for polishing in the examples and comparative examples of the invention.

Thus was formed an irregularity pattern comprising the silicon nitride film and silicon substrate, having line-and-space with a width of 100 μm, a pitch of 200 μm and a depth of 200 nm. Finally, a 300 nm-thick silicon oxide film was accumulated on the irregularity pattern using plasma CVD by plasma reaction of tetraethoxysilane and oxygen. The final structure of the substrate obtained in this manner was 300 nm-thick silicon oxide film 3/100 nm-thick silicon nitride film 4 (polishing stop layer)/silicon substrate 5 at the wide convexities, as shown in the schematic cross-sectional view of FIG. 2. The film structure at the wide concavity was 300 nm-thick silicon oxide film 3/silicon substrate 5. The step height between the wide convexity and wide convexity was 200 nm.

A SiO₂/pSi patterned substrate was also prepared. This substrate was produced in the following manner. Specifically, a low-pressure thermal CVD method was used by thermal reaction of monosilane at low pressure to accumulate a polysilicon film with a thickness of 100 nm on a flat-surface silicon substrate (circular, diameter: 200 mm), and a photoresist film with a thickness of 500 nm was further coated thereover. In a known photolithography step using a photomask, the photoresist film was exposed and developed for a line-and-space pattern with a width of 100 μm and a pitch of 200 μm. Next, in a known dry etching step, the polysilicon film and silicon substrate were subjected to dry etching of 100 nm each, and the photoresist film was removed in an ashing step by oxygen plasma.

Figure 3:
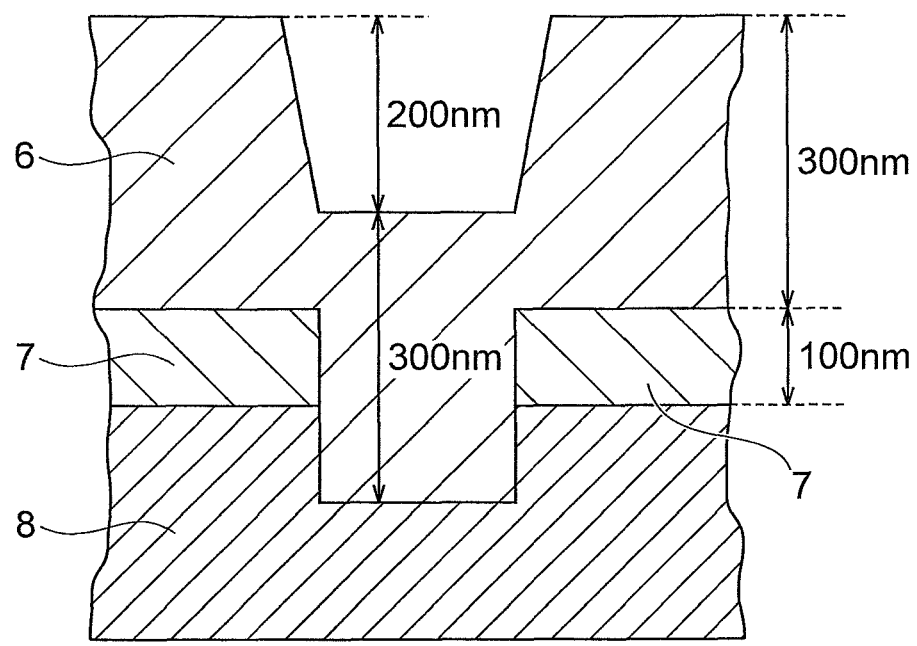
FIG. 3 is a schematic cross-sectional view of a $SiO_2$/pSi patterned substrate used for polishing in the examples and comparative examples of the invention.

Thus was formed an irregularity pattern comprising the polysilicon film and silicon substrate, having line-and-space with a width of 100 μm, a pitch of 200 μm and a depth of 200 nm. Finally, a 300 nm-thick silicon oxide film was accumulated on the irregularity pattern using plasma CVD by plasma reaction of tetraethoxysilane and oxygen. The final structure of the substrate obtained in this manner was 300 nm-thick silicon oxide film 6/100 nm-thick polysilicon film 7 (polishing stop layer)/silicon substrate 8 at the wide convexities, as shown in the schematic cross-sectional view of FIG. 3. The wide concavities had the structure: 300 nm-thick silicon oxide film/silicon substrate. The step height between the wide convexity and wide convexity was 200 nm.

(Polishing of Substrate)

A 2-layer type foamed polyurethane polishing pad (IC1000 by Rohm & Haas, having concentric circular furrows on the main pad surface, main pad Shore D hardness: 59) was attached to the polishing platen of a polishing apparatus (EPO-111, product of Ebara Corp.). Before using the polishing pad, a diamond abrasive conditioner (CMP-N 100A, product of Asahi Diamond Industrial Co., Ltd., diamond abrasive mesh size: 100) was used for conditioning of the polishing pad for 30 minutes.

Next, the substrate to be polished was attached to a substrate holder, and a polishing agent was supplied onto the polishing pad. The substrate was pressed against the polishing pad, and the substrate holder and polishing platen were rotated for polishing of the substrate. The polishing agent supply rate was 200 mL/min, the polishing pressure was 40 kPa, the substrate holder rotational speed was 40 rpm and the polishing platen rotational speed was 40 rpm. After polishing the substrate, the polishing pad was conditioned for 1 minute to allow polishing of the next substrate.

The polished substrate was then cleaned with a brush cleaning using 0.5 mass % hydrofluoric acid (30 seconds), and then cleaned by brush cleaning using water (30 seconds). The cleaned substrate was dried with a spin dryer.

This procedure was carried out for each prepared substrate.

The length of the polishing time for each substrate was as follows.

SiO₂, SiN and pSi blanket substrates: Polishing for 1 minute.

SiO₂ patterned substrate: Polishing was conducted until the thickness of the wide convexity of the silicon oxide films reached 100 nm (±5 nm).

SiO₂/SiN patterned substrate: Polishing was conducted until the silicon nitride film (polishing stop layer) was exposed, and additional polishing for half of this polishing time was conducted.

SiO₂/pSi patterned substrate: Polishing was conducted until the polysilicon film (polishing stop layer) was exposed, and additional polishing for half of this polishing time was conducted.

(Polishing Results)

(Polishing Rate and Polishing Selective Ratio)

The amount of thickness reduction in the silicon oxide film of the polished SiO₂ blanket substrate was measured to calculate the silicon oxide film polishing rate (hereunder abbreviated as "Ro").

The amount of thickness reduction in the silicon nitride film of the polished SiN blanket substrate was measured to calculate the silicon nitride film polishing rate (hereunder abbreviated as "Rn").

The amount of thickness reduction in the polysilicon film of the polished pSi blanket substrate was measured to calculate the polysilicon film polishing rate (hereunder abbreviated as "Rp").

A light-interference film thickness measuring apparatus (Nanospec AFT-5100 by Nanometrics, Inc.) was used for measurement of the film thickness necessary to calculate the polishing rate.

The polishing selective ratio of the silicon oxide film with respect to the silicon nitride film (hereunder abbreviated as "Sn") was calculated by determining the ratio of Ro with respect to Rn (Ro/Rn).

The polishing selective ratio of the silicon oxide film with respect to the polysilicon film (hereunder abbreviated as "Sp") was calculated by determining the ratio of Ro with respect to Rp (Ro/Rp).

(Number of Scratches)

The total number of scratches observed on the silicon oxide film surface of the polished $SiO_2$ blanket substrate was recorded as the number of scratches on the silicon oxide film. The scratches were observed using a scanning electron microscope-type Defect Review System (SEMVision, product of Applied Materials, Inc.), with a concave shape defect (size: ≥0.2 μm) in the silicon oxide film surface being judged as a scratch.

(Flatness)

The step height of the silicon oxide film at the wide convexity and wide concavity of the polished $SiO_2$ patterned substrate (hereunder abbreviated as "Δo") was measured to evaluate the flatness after polishing of the $SiO_2$ patterned substrate. A smaller Δo value indicates higher flatness.

The step height between the wide convexity (silicon nitride film) and wide concavity (silicon oxide film) of the polished $SiO_2$/SiN patterned substrate (hereunder abbreviated as "Δn") was measured to evaluate the flatness after polishing of the $SiO_2$/SiN patterned substrate. A smaller Δn value indicates higher flatness.

The step height between the wide convexity (polysilicon film) and wide concavity (silicon oxide film) of the polished $SiO_2$/pSi patterned substrate (hereunder abbreviated as "Δp") was measured to evaluate the flatness after polishing of the $SiO_2$/pSi patterned substrate. A smaller Δp value indicates higher flatness.

Measurement of the step height, necessary for evaluation of the flatness, was accomplished using a stylus-type profilometer (Dektak V200Si by Veeco Instruments, Inc.).

(Polishing Stop Property)

The amount of thickness reduction in the silicon nitride film (polishing stop layer) of the polished $SiO_2$/SiN patterned substrate (hereunder abbreviated as "Ln") was measured. A smaller Ln value indicates a higher polishing stop property by the silicon nitride film.

The amount of thickness reduction in the polysilicon film (polishing stop layer) of the polished $SiO_2$/pSi patterned substrate (hereunder abbreviated as "Lp") was measured, and a smaller Lp value indicates a higher polishing stop property by the polysilicon film.

A light-interference film thickness measuring apparatus (Nanospec AFT-5100 by Nanometrics, Inc.) was used for measurement of the film thickness necessary for evaluation of the polishing stop property.

In polishing using polishing agent A1, Ro was 197 nm/min, Rn was 1.1 nm/min, Rp was 0.7 nm/min, Sn was 183, Sp was 295, the number of scratches was 0, Δo was 16 nm, Δn was 17 nm, Δp was 16 nm, Ln was 0.8 nm and Lp was 0.5 nm.

Example 2

(Preparation of Polishing Agent)

A cerium hydroxide concentrated slurry containing 1 mass % of cerium hydroxide particles was obtained by the same method as in Example 1.

Also, a concentrated additional solution was prepared comprising 1 mass % of cationized polyvinyl alcohol (C-506 by Kuraray Co., Ltd., cationic, saponification degree: 74.0-79.0 mol %, mean
polymerization degree: 600), 0.2 mass % of chitosan (DAI-CHITOSAN 100D (VL) by Dainichiseika Color & Chemicals Mfg. Co., Ltd.), 0.2 mass % of acetic acid, 0.2 mass % of imidazole and water.

Next, 100 g of the cerium hydroxide concentrated slurry, 100 g of the concentrated additional solution and 800 g of water were mixed to obtain polishing agent A2. The final contents of each component in polishing agent A2 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent A2, the mean particle size of the cerium hydroxide particles in the polishing agent was 104 nm, the zeta potential of the cerium hydroxide particles in the polishing agent was 16 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1. In polishing using polishing agent A2, Ro was 205 nm/min, Rn was 1.0 nm/min, Rp was 0.6 nm/min, Sn was 201, Sp was 352, the number of scratches was 0, Δo was 14 nm, Δn was 15 nm, Δp was 16 nm, Ln was 0.7 nm and Lp was 0.4 nm.

Example 3

(Preparation of Polishing Agent)

A cerium hydroxide concentrated slurry containing 1 mass % of cerium hydroxide particles was obtained by the same method as in Example 1.

Also, a concentrated additional solution was prepared comprising 1 mass % of cationized polyvinyl alcohol (C-506 by Kuraray Co., Ltd., cationic, saponification degree: 74.0-79.0 mol %, mean polymerization degree: 600), 0.1 mass % of chitosan (DAICHITOSAN 100D by Dainichiseika Color & Chemicals Mfg. Co., Ltd.), 0.2 mass % of acetic acid, 0.2 mass % of imidazole and water. The chitosan was a type with a 20° C. viscosity of 40-100 mPa·s (manufacturer's nominal value) for a solution comprising 0.5 mass % of chitosan, 0.5 mass % of acetic acid and water.

Next, 100 g of the cerium hydroxide concentrated slurry, 100 g of the concentrated additional solution and 800 g of water were mixed to obtain polishing agent A3. The final contents of each component in polishing agent A3 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent A3, the mean particle size of the cerium hydroxide particles in the polishing agent was 108 nm, the zeta potential of the cerium hydroxide particles in the polishing agent was 18 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1.

In polishing using polishing agent A3, Ro was 219 nm/min, Rn was 1.2 nm/min, Rp was 0.7 nm/min, Sn was 189, Sp was 320, the number of scratches was 0, Δo was 15 nm, Δn was 17 nm, Δp was 17 nm, Ln was 0.8 nm and Lp was 0.5 nm.

Example 4

(Preparation of Polishing Agent)

A cerium hydroxide concentrated slurry containing 1 mass % of cerium hydroxide particles was obtained by the same method as in Example 1.

Also, a concentrated additional solution was prepared comprising 1 mass % of cationized polyvinyl alcohol (C-506 by Kuraray Co., Ltd., cationic, saponification degree: 74.0-79.0 mol %, mean polymerization degree: 600), 0.4 mass % of glyceryl chitosan (Dainichiseika Color & Chemicals Mfg. Co., Ltd.), 0.2 mass % of acetic acid, 0.2 mass % of imidazole and water. The glyceryl chitosan was a type with a 20° C. viscosity of 399 mPa·s (manufacturer's nominal value) for a solution comprising 10 mass % of glyceryl chitosan, 5 mass % of acetic acid and water.

Next, 100 g of the cerium hydroxide concentrated slurry, 100 g of the concentrated additional solution and 800 g of water were mixed to obtain polishing agent A4. The final contents of each component in polishing agent A4 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent A4, the mean particle size of the cerium hydroxide particles in the polishing agent was 114 nm, the zeta potential of the cerium hydroxide particles in the polishing agent was 14 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1.

In polishing using polishing agent A4, Ro was 201 nm/min, Rn was 1.3 nm/min, Rp was 1.0 nm/min, Sn was 158, Sp was 210, the number of scratches was 0, Δo was 13 nm, Δn was 14 nm, Δp was 15 nm, Ln was 0.9 nm and Lp was 0.7 nm.

Example 5

(Preparation of Polishing Agent)

Polishing agent A1 was prepared as in Example 1.

(Polishing of Substrate)

A substrate was polished by the same method as Example 1, except for using a 2-layer type non-foamed polyurethane polishing pad (NCP Series by Nihon Micro Coating Co., Ltd., having concentric circular furrows on main pad surface, main pad Shore D hardness: 81) as the polishing pad.

(Polishing Results)

The Ro, Rn, Rp, Sn, Sp, number of scratches, Δo, Δn, Δp, Ln and Lp were determined by the same methods as in Example 1.

In polishing using polishing agent A1, Ro was 210 nm/min, Rn was 1.5 nm/min, Rp was 1.2 nm/min, Sn was 140, Sp was 175, the number of scratches was 0, Δo was 5 nm, Δn was 6 nm, Δp was 6 nm, Ln was 1.1 nm and Lp was 0.9 nm.

Comparative Example 1

(Preparation of Polishing Agent)

A cerium hydroxide concentrated slurry containing 1 mass % of cerium hydroxide particles was obtained by the same method as in Example 1.

A concentrated additional solution was also prepared comprising 0.2 mass % of acetic acid, 0.2 mass % of imidazole and water.

Next, 100 g of the cerium hydroxide concentrated slurry, 100 g of the concentrated additional solution and 800 g of water were mixed to obtain polishing agent B1. The final contents of each component in polishing agent B1 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent B1, the mean particle size of the cerium hydroxide particles in the polishing agent was 94 nm, the zeta potential of the cerium hydroxide particles in the polishing agent was 43 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1.

In polishing using polishing agent B1, Ro was 428 nm/min, Rn was 134 nm/min, Rp was 84 nm/min, Sn was 3.2, Sp was 5.1, the number of scratches was 0, Δo was 145 nm, Δn was 116 nm, Δp was 130 nm, Ln was 47 nm and Lp was 29 nm.

Comparative Example 2

(Preparation of Polishing Agent)

A cerium hydroxide concentrated slurry containing 1 mass % of cerium hydroxide particles was obtained by the same method as in Example 1.

Also, a concentrated additional solution was prepared comprising 2 mass % of cationized polyvinyl alcohol (C-506 by Kuraray Co., Ltd., cationic, saponification degree: 74.0-79.0 mol %, mean polymerization degree: 600), 0.2 mass % of acetic acid, 0.2 mass % of imidazole and water.

Next, 100 g of the cerium hydroxide concentrated slurry, 100 g of the concentrated additional solution and 800 g of water were mixed to obtain polishing agent B2. The final contents of each component in polishing agent B2 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent B2, the mean particle size of the cerium hydroxide particles in the polishing agent was 127 nm, the zeta potential of the cerium hydroxide particles in the polishing agent was 10 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1.

In polishing using polishing agent B2, Ro was 198 nm/min, Rn was 54 nm/min, Rp was 2.1 nm/min, Sn was 3.7, Sp was 94, the number of scratches was 0, Δo was 87 nm, Δn was 83 nm, Δp was 88 nm, Ln was 41 nm and Lp was 1.6 nm.

Comparative Example 3

(Preparation of Polishing Agent)

A cerium hydroxide concentrated slurry containing 1 mass % of cerium hydroxide particles was obtained by the same method as in Example 1.

Also, a concentrated additional solution was prepared comprising 0.4 mass % of chitosan (DAICHITOSAN 100D (VL) by Dainichiseika Color & Chemicals Mfg. Co., Ltd.), 0.2 mass % of acetic acid, 0.2 mass % of imidazole and water.

Next, 100 g of the cerium hydroxide concentrated slurry, 100 g of the concentrated additional solution and 800 g of water were mixed to obtain polishing agent B3. The final contents of each component in polishing agent B3 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent B3, the mean particle size of the cerium hydroxide particles in the polishing agent was 102 nm, the zeta potential of the cerium hydroxide particles in the polishing agent was 29 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1.

In polishing using polishing agent B3, Ro was 215 nm/min, Rn was 12 nm/min, Rp was 43 nm/min, Sn was 18, Sp was 5.0, the number of scratches was 0, Δo was 91 nm, Δn was 97 nm, Δp was 77 nm, Ln was 9.7 nm and Lp was 30 nm.

Comparative Example 4

(Preparation of Polishing Agent)

A cerium hydroxide concentrated slurry containing 1 mass % of cerium hydroxide particles was obtained by the same method as in Example 1.

Also, a concentrated additional solution was prepared comprising 0.3 mass % of polyvinyl alcohol (Wako Pure Chemical Industries, Ltd., nonionic, saponification degree: 98.0 mol %, mean polymerization degree: 2000), 0.2 mass % of chitosan (DAICHITOSAN 100D (VL) by Dainichiseika Color & Chemicals Mfg. Co., Ltd.), 0.2 of mass % acetic acid, 0.2 mass % of imidazole and water.

Next, 100 g of the cerium hydroxide concentrated slurry, 100 g of the concentrated additional solution and 800 g of water were mixed to obtain polishing agent B4. The final contents of each component in polishing agent B4 are shown in Table 1.

(Polishing Agent Properties)

The mean particle size of the cerium hydroxide particles in the polishing agent, the zeta potential of the cerium hydroxide particles in the polishing agent and the pH of the polishing agent were measured by the same methods as in Example 1.

For polishing agent B4, the mean particle size of the cerium hydroxide particles in the polishing agent was 138 nm, the zeta potential of the cerium hydroxide particles in the polishing agent was 9 mV, and the pH of the polishing agent was 6.0.

(Polishing Results)

The Ro, Rn, Rp, Sn, Sp, number of scratches, Δo, Δn, Δp, Ln and Lp were determined by the same methods as in Example 1.

In polishing using polishing agent B4, Ro was 204 nm/min, Rn was 12 nm/min, Rp was 2.2 nm/min, Sn was 17, Sp was 93, the number of scratches was 0, Δo was 83 nm, Δn was 80 nm, Δp was 87 nm, Ln was 10 nm and Lp was 1.6 nm.

Comparative Example 5

(Preparation of Polishing Agent)

After placing 400 g of cerium carbonate hydrate in a platinum container, it was fired at 675° C. for 2 hours in air to obtain 200 g of a cerium oxide fired powder. The cerium oxide fired powder was then subjected to dry grinding with a jet mill to obtain cerium oxide particles. Next, a suitable amount of water was added to the cerium oxide particles to obtain a cerium oxide concentrated slurry comprising 1 mass % of cerium oxide particles.

A concentrated additional solution was also prepared comprising 0.2 mass % of acetic acid, 0.2 mass % of imidazole and water.

Next, 500 g of the cerium oxide concentrated slurry, 100 g of the concentrated additional solution and 400 g of water were mixed to obtain polishing agent B5. The final contents of each component in polishing agent B5 are shown in Table 1.

(Polishing Agent Properties)

The mean particle size of the cerium oxide particles in the polishing agent, the zeta potential of the cerium oxide particles in the polishing agent and the pH of the polishing agent were measured by the same methods as in Example 1.

For polishing agent B5, the mean particle size of the cerium oxide particles in the polishing agent was 407 nm, the zeta potential of the cerium oxide particles in the polishing agent was 34 mV, and the pH of the polishing agent was 6.0.

(Fabrication of Substrate)

A $SiO_2$ blanket substrate, SiN blanket substrate, pSi blanket substrate, $SiO_2$ patterned substrate, $SiO_2$/SiN patterned substrate and $SiO_2$/pSi patterned substrate were prepared by the same methods as in Example 1.

(Polishing of Substrate)

Each substrate was polished and cleaned by the same method as in Example 1.

(Polishing Results)

The Ro, Rn, Rp, Sn, Sp, number of scratches, Δo, Δn, Δp, Ln and Lp were determined by the same methods as in Example 1.

In polishing using polishing agent B5, Ro was 207 nm/min, Rn was 58 nm/min, Rp was 43 nm/min, Sn was 3.6, Sp was 4.8, the number of scratches was 24, Δo was 121 nm, Δn was 97 nm, Δp was 101 nm, Ln was 42 nm and Lp was 31 nm.

Comparative Example 6

(Preparation of Polishing Agent)

A cerium oxide concentrated slurry containing 1 mass % of cerium oxide particles was obtained by the same method as in Comparative Example 6.

Also, a concentrated additional solution was prepared comprising 1 mass % of cationized polyvinyl alcohol (C-506 by Kuraray Co., Ltd., cationic, saponification degree: 74.0-79.0 mol %, mean polymerization degree: 600), 0.2 mass % of chitosan (DAICHITOSAN 100D (VL) by Dainichiseika Color & Chemicals Mfg. Co., Ltd.), 0.2 mass % of acetic acid, 0.2 mass % of imidazole and water.

Next, 500 g of the cerium oxide concentrated slurry, 100 g of the concentrated additional solution and 400 g of water were mixed to obtain polishing agent B6. The final contents of each component in polishing agent B6 are shown in Table 1.

(Polishing Agent Properties)

The mean particle size of the cerium oxide particles in the polishing agent, the zeta potential of the cerium oxide particles in the polishing agent and the pH of the polishing agent were measured by the same methods as in Example 1.

For polishing agent B6, the mean particle size of the cerium oxide particles in the polishing agent was 414 nm, the zeta potential of the cerium oxide particles in the polishing agent was 30 mV, and the pH of the polishing agent was 6.0.

(Fabrication of Substrate)

A $SiO_2$ blanket substrate, SiN blanket substrate, pSi blanket substrate, $SiO_2$ patterned substrate, $SiO_2$/SiN patterned substrate and $SiO_2$/pSi patterned substrate were prepared by the same methods as in Example 1.

(Polishing of Substrate)

Each substrate was polished and cleaned by the same method as in Example 1.

(Polishing Results)

The Ro, Rn, Rp, Sn, Sp, number of scratches, Δo, Δn, Δp, Ln and Lp were determined by the same methods as in Example 1.

In polishing using polishing agent B6, Ro was 173 nm/min, Rn was 40 nm/min, Rp was 28 nm/min, Sn was 4.3, Sp was 6.2, the number of scratches was 35, Δo was 116 nm, Δn was 93 nm, Δp was 94 nm, Ln was 35 nm and Lp was 24 nm.

TABLE 1

| | Polishing agent | Polishing agent composition | | Mean particle size (nm) | Zeta potential (mV) | pH |
| --- | --- | --- | --- | --- | --- | --- |
| | | Abrasive | Additives | | | |
| Example 1 | A1 | 0.1 mass % Cerium hydroxide | 0.03 mass % Cationized PVA (CM-318)<br>0.02 mass % Chitosan (DAICHITOSAN 100D (VL))<br>0.02 mass % Acetic acid<br>0.02 mass % Imidazole | 127 | 11 | 6.0 |
| Example 5 | | | | | | |
| Example 2 | A2 | 0.1 mass % Cerium hydroxide | 0.1 mass % Cationized PVA (C-506)<br>0.02 mass % Chitosan (DAICHITOSAN 100D (VL))<br>0.02 mass % Acetic acid<br>0.02 mass % Imidazole | 104 | 16 | 6.0 |
| Example 3 | A3 | 0.1 mass % Cerium hydroxide | 0.1 mass % Cationized PVA (C-506)<br>0.01 mass % Chitosan (DAICHITOSAN 100D)<br>0.02 mass % Acetic acid<br>0.02 mass % Imidazole | 108 | 18 | 6.0 |
| Example 4 | A4 | 0.1 mass % Cerium hydroxide | 0.1 mass % Cationized PVA (C-506)<br>0.04 mass % Glycerylated chitosan<br>0.02 mass % Acetic acid<br>0.02 mass % Imidazole | 114 | 14 | 6.0 |
| Comp. Ex. 1 | B1 | 0.1 mass % Cerium hydroxide | 0.02 mass % Acetic acid<br>0.02 mass % Imidazole | 94 | 43 | 6.0 |
| Comp. Ex. 2 | B2 | 0.1 mass % Cerium hydroxide | 0.2 mass % Cationized PVA (C-506)<br>0.02 mass % Acetic acid<br>0.02 mass % Imidazole | 127 | 10 | 6.0 |
| Comp. Ex. 3 | B3 | 0.1 mass % Cerium hydroxide | 0.04 mass % Chitosan (DAICHITOSAN 100D (VL))<br>0.02 mass % Acetic acid<br>0.02 mass % Imidazole | 102 | 29 | 6.0 |
| Comp. Ex. 4 | B4 | 0.1 mass % Cerium hydroxide | 0.03 mass % PVA<br>0.02 mass % Chitosan (DAICHITOSAN 100D (VL))<br>0.02 mass % Acetic acid<br>0.02 mass % Imidazole | 138 | 9 | 6.0 |
| Comp. Ex. 5 | B5 | 0.5 mass % Cerium oxide | 0.02 mass % Acetic acid<br>0.02 mass % Imidazole | 407 | 34 | 6.0 |
| Comp. Ex. 6 | B6 | 0.5 mass % Cerium oxide | 0.1 mass % Cationized PVA (C-506)<br>0.02 mass % Chitosan (DAICHITOSAN 100D (VL))<br>0.02 mass % Acetic acid<br>0.02 mass % Imidazole | 414 | 30 | 6.0 |

*PVA represents Polyvinyl alcohol

The results are summarized in Table 2. It is seen that the polishing agents described in Examples 1-5 have low numbers of scratches and allow polishing of silicon oxide films to a high degree of flatness. It is also seen that the polishing selective ratios for silicon nitride films and polysilicon films is high, and that the polishing stop property is excellent when a silicon nitride film or polysilicon film is used as the polishing stop layer.

The polishing agents described in Comparative Examples 1-4, which lack either or both a cationized polyvinyl alcohol and at least one type of saccharide selected from the group consisting of an amino sugar, a derivative of the amino sugar, a polysaccharide containing an amino sugar and a derivative of the polysaccharide, have low numbers of scratches, but have inferior flatness of the silicon oxide films compared to the polishing agents described in Examples 1-5. Furthermore, the polishing selective ratios for silicon nitride films and polysilicon films are lower than the polishing agents described in Examples 1-5, and the polishing stop property is inferior when using a silicon nitride film or polysilicon film as the polishing stop layer.

The polishing agent of Comparative Example 2 comprising a cationized polyvinyl alcohol has a higher polishing selective ratio on polysilicon film compared to other comparative examples, but because it does not contain chitosan, the silicon oxide film flatness is inferior compared to the polishing agents described in Examples 1-5. In addition, the polishing selective ratio for silicon nitride film is lower than the polishing agents described in Examples 1-5, and the polishing stop property is inferior when a silicon nitride film is used as the polishing stop layer.

The polishing agent of Comparative Example 3 comprising chitosan has a higher polishing selective ratio for silicon nitride film compared to other comparative examples, but because it does not contain a cationized polyvinyl alcohol, the silicon oxide film flatness is inferior compared to the polishing agents described in Examples 1-5. In addition, the polishing selective ratio for polysilicon film is lower than the polishing agents described in Examples 1-5, and the polishing stop property is inferior when a polysilicon film is used as the polishing stop layer.

The polishing agent of Comparative Example 4, despite comprising both a polyvinyl alcohol and chitosan, does not have a cationized polyvinyl alcohol, and therefore the silicon oxide film flatness is inferior compared to the polishing agents described in Examples 1-5. Furthermore, the polishing selective ratios for silicon nitride films and polysilicon films are lower than the polishing agents described in Examples 1-5, and the polishing stop property is inferior when using a silicon nitride film or polysilicon film as the polishing stop layer.

The polishing agents described in Comparative Examples 5 and 6, which employ cerium oxide particles instead of cerium hydroxide particles as the abrasive, produce a greater number of scratches than the polishing agents described in Examples 1-5, and inferior silicon oxide film flatness. Furthermore, the polishing selective ratios for silicon nitride films and polysilicon films are lower than the polishing agents described in Examples 1-5, and the polishing stop property is inferior when using a silicon nitride film or polysilicon film as the polishing stop layer.

As clearly seen by these results, the polishing agent and polishing method of the invention allow polishing of silicon oxide films with a high degree of flatness while inhibiting scratches, and can increase the polishing stop property.

TABLE 2

| | | Blanket substrate polishing results | | | | | Patterned substrate polishing results | | | | |
| | | Polishing rate (nm/min) | | | Polishing selective ratio | | Number of | Step height after polishing (nm) | | | Reduction in film thickness of polishing stop layer (nm) | |
| | Polishing agent | Ro | Rn | Rp | Sn | Sp | scratches | Δo | Δn | Δp | Ln | Lp |
|---|---|---|---|---|---|---|---|---|---|---|---|---|
| Example 1 | A1 | 197 | 1.1 | 0.7 | 183 | 295 | 0 | 16 | 17 | 16 | 0.8 | 0.5 |
| Example 2 | A2 | 205 | 1.0 | 0.6 | 201 | 352 | 0 | 14 | 15 | 16 | 0.7 | 0.4 |
| Example 3 | A3 | 219 | 1.2 | 0.7 | 189 | 320 | 0 | 15 | 17 | 17 | 0.8 | 0.5 |
| Example 4 | A4 | 201 | 1.3 | 1.0 | 158 | 210 | 0 | 13 | 14 | 15 | 0.9 | 0.7 |
| Example 5 | A1 | 210 | 1.5 | 1.2 | 140 | 175 | 0 | 5 | 6 | 6 | 1.1 | 0.9 |
| Comp. Ex. 1 | B1 | 428 | 134 | 84 | 3.2 | 5.1 | 0 | 145 | 116 | 130 | 47 | 29 |
| Comp. Ex. 2 | B2 | 198 | 54 | 2.1 | 3.7 | 94 | 0 | 87 | 83 | 88 | 41 | 1.6 |
| Comp. Ex. 3 | B3 | 215 | 12 | 43 | 18 | 5.0 | 0 | 91 | 97 | 77 | 9.7 | 30 |
| Comp. Ex. 4 | B4 | 204 | 12 | 2.2 | 17 | 93 | 0 | 83 | 80 | 87 | 10 | 1.6 |
| Comp. Ex. 5 | B5 | 207 | 58 | 43 | 3.6 | 4.8 | 24 | 121 | 97 | 101 | 42 | 31 |
| Comp. Ex. 6 | B6 | 173 | 40 | 28 | 4.3 | 6.2 | 35 | 116 | 93 | 94 | 35 | 24 |

Reference Signs List

1,3,6: Silicon oxide films (films to be polished), 2,5,8: silicon substrates, 4: silicon nitride film, 7: polysilicon film.

The invention claimed is:

1. A polishing agent comprising tetravalent metal hydroxide particles, a cationized polyvinyl alcohol, at least one type of saccharide selected from the group consisting of an amino sugar, a derivative of the amino sugar, a polysaccharide containing an amino sugar and a derivative of the polysaccharide, and water, wherein the cationized polyvinyl alcohol is a modified polyvinyl alcohol produced by introducing a cationic functional group into a polyvinyl alcohol with a monomer for introducing the cationic functional group being selected from the group consisting of acrylamide-based monomer, methacrylamide-based monomer, crotonylamide-based monomer, acrylic acid-based monomer, methacrylic acid-based monomer and crotonic acid-based monomer.

2. The polishing agent according to claim 1, wherein a mean particle size of the tetravalent metal hydroxide particles is 1-400 nm.

3. The polishing agent according to claim 1, wherein a zeta potential of the tetravalent metal hydroxide particles in the polishing agent is −30 to 50 mV.

4. The polishing agent according to claim 1, wherein a pH of the polishing agent is 3.0-11.0.

5. The polishing agent according to claim 1, wherein a content of the tetravalent metal hydroxide particles is 0.005-5 parts by mass with respect to 100 parts by mass of the polishing agent.

6. The polishing agent according to claim 1, wherein a content of the cationized polyvinyl alcohol is at least 0.005 part by mass with respect to 100 parts by mass of the polishing agent, and a content of the saccharide is at least 0.001 part by mass with respect to 100 parts by mass of the polishing agent.

7. The polishing agent according to claim 1, wherein the tetravalent metal hydroxide particles include cerium hydroxide.

8. The polishing agent according to claim 1, wherein the saccharide includes at least one type selected from the group consisting of chitosan and chitosan derivatives.

9. A concentrated one-pack polishing agent that becomes the polishing agent according to claim 1 by addition of at least water, the concentrated one-pack polishing agent comprising the tetravalent metal hydroxide particles, the cationized polyvinyl alcohol, the saccharide and the water.

10. A two-pack polishing agent which is stored with constituent components of the polishing agent according to claim 1 separated into a first solution and a second solution, so that the polishing agent is formed by mixing the first solution and the second solution, wherein the first solution comprises the tetravalent metal hydroxide particles and water.

11. The two-pack polishing agent according to claim 10, which becomes said polishing agent by mixing the first solution, the second solution and water.

12. A method for polishing a substrate, comprising a step of polishing a film to be polished, formed on a substrate having the film to be polished, by relatively moving the substrate and a polishing platen, in a state that the film to be polished is pressed against a polishing pad on the polishing platen, while supplying the polishing agent according to claim 1 between the film to be polished and the polishing pad.

13. The method for polishing a substrate according to claim 12, wherein at least a portion of the film to be polished is a silicon oxide-based insulating film.

14. The method for polishing a substrate according to claim 12, wherein at least a portion of the film to be polished is a silicon nitride film or polysilicon film.

15. The polishing agent according to claim 1, further comprising an acid component.

16. The polishing agent according to claim 15, wherein the acid component includes at least one selected from the group consisting of nitric acid, sulfuric acid, hydrochloric acid, phosphoric acid, boric acid, formic acid, acetic acid, propionic acid, butyric acid, valeric acid, caproic acid, lactic acid, malonic acid, succinic acid, glutaric acid, adipic acid, maleic acid, fumaric acid, phthalic acid, citric acid, picolinic acid and uric acid.

17. The polishing agent according to claim 1, further comprising an alkaline component.

18. The polishing agent according to claim 17, wherein the alkaline component includes at least one selected from the group consisting of potassium hydroxide, sodium hydroxide, ammonia, tetramethylammonium hydroxide and imidazole.

19. The polishing agent according to claim 1, wherein the cationized polyvinyl alcohol has a degree of modification by the cationic functional group of at least 0.1 mol %.

20. The polishing agent according to claim 1, wherein the cationized polyvinyl alcohol has a saponification degree of at least 50 mol %.

21. The polishing agent according to claim 1, wherein the cationized polyvinyl alcohol has a mean polymerization degree in the range of 50 to 3,000.

* * * * *